(12) United States Patent
Inoue et al.

(10) Patent No.: US 6,815,735 B2
(45) Date of Patent: Nov. 9, 2004

(54) SEMICONDUCTOR DEVICE

(75) Inventors: Akira Inoue, Kadoma (JP); Takeshi Takagi, Kyoto (JP); Yoshihiro Hara, Hirakata (JP); Minoru Kubo, Nabari (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/311,267
(22) PCT Filed: Apr. 18, 2002
(86) PCT No.: PCT/JP02/03890
  § 371 (c)(1),
  (2), (4) Date: Dec. 13, 2002
(87) PCT Pub. No.: WO02/086976
  PCT Pub. Date: Oct. 31, 2002

(65) Prior Publication Data
  US 2003/0146473 A1 Aug. 7, 2003

(30) Foreign Application Priority Data
  Apr. 18, 2001 (JP) ........................................ 2001-119586

(51) Int. Cl.$^7$ .......................................... H01L 31/0328
(52) U.S. Cl. ........................ 257/192; 257/616; 257/347
(58) Field of Search ................................ 257/192, 616, 257/77, 347, 190, 191

(56) References Cited

U.S. PATENT DOCUMENTS 5,777,364 A    7/1998  Crabbe et al.
6,512,252 B1 * 1/2003  Takagi et al. ................ 257/192

FOREIGN PATENT DOCUMENTS

| EP | 0 494 395     | 7/1992  |
| EP | 1 020 900     | 7/2000  |
| EP | 1 102 327 A2  | 5/2001  |
| EP | 1 253 648     | 10/2002 |
| JP | 2000-260991   | 9/2000  |
| JP | 2000-269501   | 9/2000  |
| JP | 2001-210831 A | 8/2001  |

OTHER PUBLICATIONS

"A Novel High Performance SiGe Channel Heterostructure Dynamic Threshold pMOSFET (HDTMOS)" T. Takagi et al., IEEE Electron Device Letters, May 2001, vol. 22, No. 5, pp. 206–208.

"SiGe–Channel Heterojunction p–MOSFET" S. Verdonckt–Vandebroek et al., IEEE Transactions on Electron Devices, Jan. 1994, vol. 41, No. 1, pp. 90–101.

"Dynamic Threshold–Voltage MOSFET (DTMOS) for Ultra–Low Voltage VLSI" F. Assaderaghi et al. , IEEE Transactions on Electron Devices, Mar. 1997, vol. 44, No. 3, pp. 414–422.

(List continued on next page.)

Primary Examiner—Mark V. Prenty
(74) Attorney, Agent, or Firm—McDermott Will & Emery LLP

(57) ABSTRACT

A semiconductor layer 30 of a graded SiGe-HDTMOS is constructed of an upper Si film 12, an Si buffer layer 13, an $Si_{1-x}Ge_x$ film 14 and an Si cap layer 15. The region between a source region 20a and drain region 20b of the semiconductor layer 30 includes a high concentration n-type Si body region 22 and an n Si region 23, an Si cap region 25 and an SiGe channel region 24. A Ge composition ratio x of the $Si_{1-x}Ge_x$ film 14 is made to increase from the Si buffer layer 13 to the Si cap layer 15. For the p-type HDTMOS, the electron current component of the substrate current decreases.

15 Claims, 13 Drawing Sheets

OTHER PUBLICATIONS

"Dynamic Threshold–Voltage MOSFET (DTMOS) for Ultra–Low Voltage Operation" F. Assaderaghi et al., IEEE IEDM 94–809, 1994, pp. 33.1.1.

Bae G J et al: "A novel sige–inserted SOI Structure for high performance PDSOI CMOSFETs" IEDM 2000, Dec. 10, 2000, pp. 667–670, XP010531851, figures 1,7,17–21.

Pelloie J–L: "SOI for low–power low–voltage –Bulk versus SOI" Microelectronic Engineering, Elsevier Publishers BV., Amsterdam, NL vol. 39, No. 1–4, Dec. 1, 1997, pp. 155–166, XP004099507.

Ferlet–Cavrois V et al: "Designing MOS/SOI Transistors for High Frequency and Low Voltage Applications" Microelectronic Engineering, Elsevier Publishers BV., Amsterdam, NL, vol. 48, No. 1–4, Sep. 1999, pp. 351–354, XP004193320.

Persun M et al: "Design of silicon on insulator (SOI) SiGe p–MOSFET for CMOS applications" University/Government/Industry Microelectronics Symposium, 1997 Proceedings of the Twelfth Biennial Rochester, NY, USA Jul. 20–23, 1997, New York, NY, USA, IEEE, US, Jul. 20, 1997, pp. 103–106 XP010242545.

* cited by examiner

SEMICONDUCTOR DEVICE

TECHNICAL FIELD

The present invention relates to a semiconductor device that functions as a DTMOS or MISFET having a heterojunction type active region and, more particularly, a semiconductor device that operates at a low supply voltage.

BACKGROUND ART

Battery-driven portable personal digital assistances have come into wide use in recent years. For such devices, there is a strong demand for a reduction of supply voltages without sacrificing high-speed operations to prolong the battery life. In order to realize a high-speed operation even at a low supply voltage, it is effective to reduce a threshold voltage. In this case, there is naturally a lower limit to the threshold voltage because a leakage current when the gate is OFF increases.

Thus, as disclosed, for example, in a document "A Dynamic Threshold Voltage MOSFET (DTMOS) for Ultra-Low Voltage Operation" (F. Assaderaghi et al., IEDM94 Ext. Abst. p.809), a device called DTMOS (Dynamic Threshold Voltage MOSFET) is proposed which solves the above described problem, provides a small leakage current even at a low voltage and has high drive performance.

A conventional DTMOS includes a gate insulating film provided on an active region of a semiconductor substrate, a gate electrode, source and drain regions provided in region located at both sides of the gate in the active region and a channel region provided in a region between the source and drain regions of the substrate active region. A substrate region (body region) located below or beside the channel region is connected to the gate electrode using a wire so that the two are electrically short-circuited. Then, when a bias voltage is applied to the gate with the gate and body short-circuited, a forward bias voltage as high as the gate bias voltage is applied to the channel region through the body. This creates a state similar to that of a normal MOS transistor when the gate bias is OFF. On the other hand, when the gate bias is ON, the body is biased in the forward direction as the gate bias voltage increases, and therefore the threshold voltage decreases.

When compared to an ordinary MOS transistor (transistor whose gate is not short-circuited with the body) formed on an SOI substrate, such a DTMOS has a leakage current equivalent to the leakage current of the ordinary transistor when the gate bias is OFF. On the other hand, when the gate bias is ON, as described above, the threshold decreases, and therefore a gate-over-drive effect increases and the drive force increases significantly. Furthermore, since there is little potential difference between the gate and channel region of the DTMOS, the electric field in the longitudinal direction on the surface of the substrate becomes extremely small compared to the ordinary transistor. As a result, the deterioration of mobility of carriers with the increase of the electric field in the longitudinal direction is suppressed, which increases the drive force significantly.

Thus, the DTMOS functions as a transistor capable of a high-speed operation at a low threshold voltage, that is, a low supply voltage within an operating voltage range after a transverse parasitic bipolar transistor generated between the source region (emitter), body (base) and drain region (collector) turns ON and grows to such an extent that the substrate current becomes problematic from a practical standpoint.

PROBLEMS TO BE SOLVED

However, according to the above described conventional DTMOS, the source and channel/body are biased in the forward direction with the increase of the gate bias voltage, and therefore a current called "substrate current" flows between the source and channel/body and gate. Thus, it is preferable for the DTMOS to suppress this substrate current and at the same time reduce the threshold to thereby secure a wide operating voltage range. Since it is possible to assume a simple model in which PN junction diodes exist between the source and body and between the source and channel, the substrate current is determined by the material of the semiconductor (band gap) and concentration of impurities in the junction region. Since the source region is generally doped with impurities of high concentration on the order of $1 \times 10^{20}$ atoms·cm$^{-3}$, if the concentration of impurities of the body is increased, it is possible to suppress the source-body component of the substrate current.

However, since the threshold also increases as the concentration of impurities of the body increases, it is actually difficult to secure a wide operating voltage range by increasing the concentration of impurities of the body.

DISCLOSURE OF THE INVENTION

It is an object of the present invention to provide a semiconductor device capable of increasing concentration of impurities of the body region and with a small substrate current and a wide operating voltage range.

A first semiconductor device of the present invention is provided with a semiconductor layer including at least a first semiconductor film, a second semiconductor film having a band gap different from that of the first semiconductor film constructed in such a way that the band gap decreases from the location next to the first semiconductor film in the direction away from the first semiconductor film, a gate insulating film provided on the semiconductor layer, a gate electrode provided on the gate insulating film, source and drain regions formed by introducing a first conductive type impurity to the region located at both sides of the gate electrode of the semiconductor layers, a channel region formed by introducing a second conductive type impurity to a region located between the source and drain regions of the second semiconductor film, a body region formed by introducing a second conductive type impurity which has higher concentration than the channel region to a region located between the source and drain regions of the second semiconductor film and a conductive member for electrically connecting the gate electrode and body region.

In this way, a potential recess (well) is formed at the band edge where second conductive type carriers run in the part located in the source and drain regions of the second semiconductor film, which secures a low threshold voltage and reduces an overall substrate current.

The first semiconductor film above is preferably made up of a semiconductor whose composition is expressed as $Si_{1-x1-y1}Ge_{x1}C_{y1}$ ($0 \leq x1 < 1$, $0 \leq y1 < 1$) and the second semiconductor film above is preferably made up of a semiconductor whose composition is expressed as $Si_{1-x2-y2}Ge_{x2}C_{y2}$ ($0 \leq x2 \leq 1$, $0 \leq y2 \leq 1$, $x2+y2>0$).

The above first semiconductor film is made of silicon and the above second semiconductor film is made of a semiconductor whose composition is expressed as $Si_{1-x3}Ge_{x3}$ ($0<x3 \leq 0.4$) and the Ge composition ratio of the above second semiconductor film increases from the location neighboring the first semiconductor film upward, and therefore a large band offset is formed at the edge of a valence band of the channel region and it is possible to obtain a structure appropriate for a p-channel type transistor.

The above described first semiconductor film is made of silicon, the second semiconductor film is made of semiconductor whose composition is expressed as $Si_{1-y3}C_{y3}$ ($0<y3\leq0.03$), and because the C composition ratio of the second semiconductor film increases from the location adjacent to the first semiconductor film upward, a large band offset is formed at the edge of the conduction band of the channel region, which makes it possible to obtain a structure suitable for an n-channel type transistor.

The above described first semiconductor film is made of silicon, the second semiconductor film is composed of $Si_{1-x4-y4}Ge_{x4}C_{y4}$ ($0<x4\leq0.4$, $0<y4\leq0.03$), and therefore it is possible to obtain a structure suitable for both n-channel type and p-channel type transistors.

The above described first conductive type is an n-type and second conductive type is a p-type, and of the substrate current that flows from the body region into the region located in the source and drain regions of the first semiconductor film, the component to which holes contribute is preferably smaller than the component to which electrons contribute.

The above described first conductive type is a p-type and second conductive type is an n-type, and of the substrate current that flows from the body region into the region located in the source and drain regions of the first semiconductor film, the component to which electrons contribute is preferably smaller than the component to which holes contribute.

The above described semiconductor layer further includes a third semiconductor film provided between the first semiconductor film and second semiconductor film, and further includes a buffer region that includes a second conductive type impurity of lower concentration than the body region or an undoped buffer region provided in the region located between the source and drain regions of the third semiconductor film, and therefore in the part located in the source and drain regions of the second semiconductor film, the potential recess at the edge of the band where the second conductive type carriers run goes away from the body region, which suppresses the substrate current.

It is preferable that the above described semiconductor layer be further provided with an Si cap region between the second semiconductor film and the gate insulating film.

Provision of the additional insulating layer under the first semiconductor film makes it possible to obtain a semiconductor device that operates especially fast.

The second semiconductor device of the present invention is provided with a semiconductor layer including at least a first semiconductor film, a second semiconductor film placed on the first semiconductor film having smaller potential with respect to carriers at the edge of the band through which carriers run than the first semiconductor film and a third semiconductor film between the first semiconductor film and second semiconductor film, agate insulating film provided on the semiconductor layer, a gate electrode provided on the gate insulating film, source and drain regions formed by introducing a first conductive type impurity to regions located at both sides of the gate electrode of the semiconductor layer, a channel region formed by introducing a second conductive type impurity to a region located between the source and drain regions of the second semiconductor film, a body region formed by introducing a second conductive type impurity of higher concentration than that of the channel region to a region located between the source and drain regions of the second semiconductor film, a buffer region including a second conductive type impurity of lower concentration than that of the body region or an undoped buffer region provided in a region located between the source and drain regions of the third semiconductor film and a conductive member for electrically connecting the gate electrode and body region.

This forms a potential recess (well) at the edge of the band through which the second conductive type carriers run in the part of the second semiconductor film located between the source and drain regions, but since the third semiconductor film is provided, the distance between this potential recess and the first semiconductor film increases. On the other hand, due to the built-in potential of the band on the longitudinal plane that passes through the gate electrode of the semiconductor device, the band is bent in the direction that interferes with the movement of the second conductive type carriers in the body region as it goes away from the first semiconductor film. This prevents the second conductive type carriers in the body region from passing through the channel region made up of the second semiconductor film and entering the part of the second semiconductor film which is located between the source and drain regions, thus reducing an overall substrate current.

The thickness of the third semiconductor film is preferably 15 nm or more or more preferably 30 nm or more.

BEST MODE FOR CARRYING OUT THE INVENTION

First Embodiment

A first embodiment will describe an embodiment of an HDTMOS using SiGe having a graded composition as a material for making up a channel region and using Si/SiGe heterojunction (hereinafter referred to as "graded composition SiGe-HDTMOS").

Figure 1A:
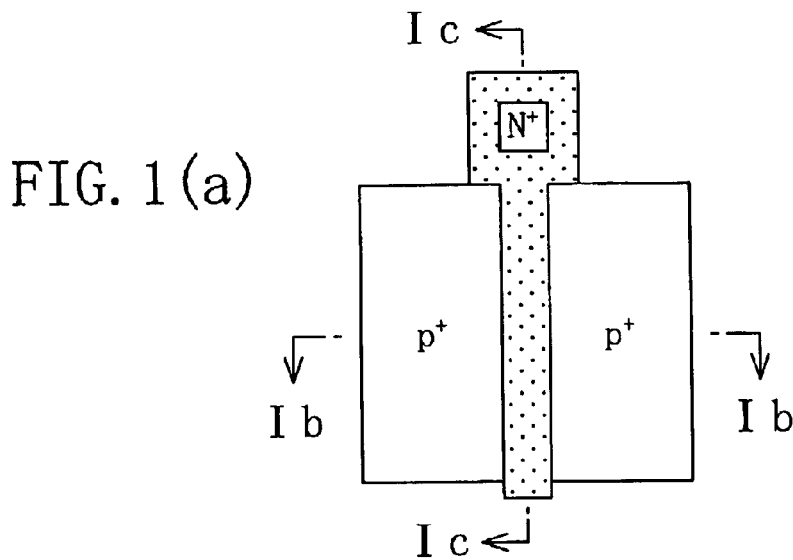
FIGS. 1(a), 1(b) and 1(c) are a plan view schematically showing a structure of a p-channel type graded SiGe-HDTMOS of this embodiment, a cross-sectional view on an Ib—Ib line shown in FIG. 1(a) and a cross-sectional view on an Ic—Ic line shown in FIG. 1(a), respectively.
Figure 1B:
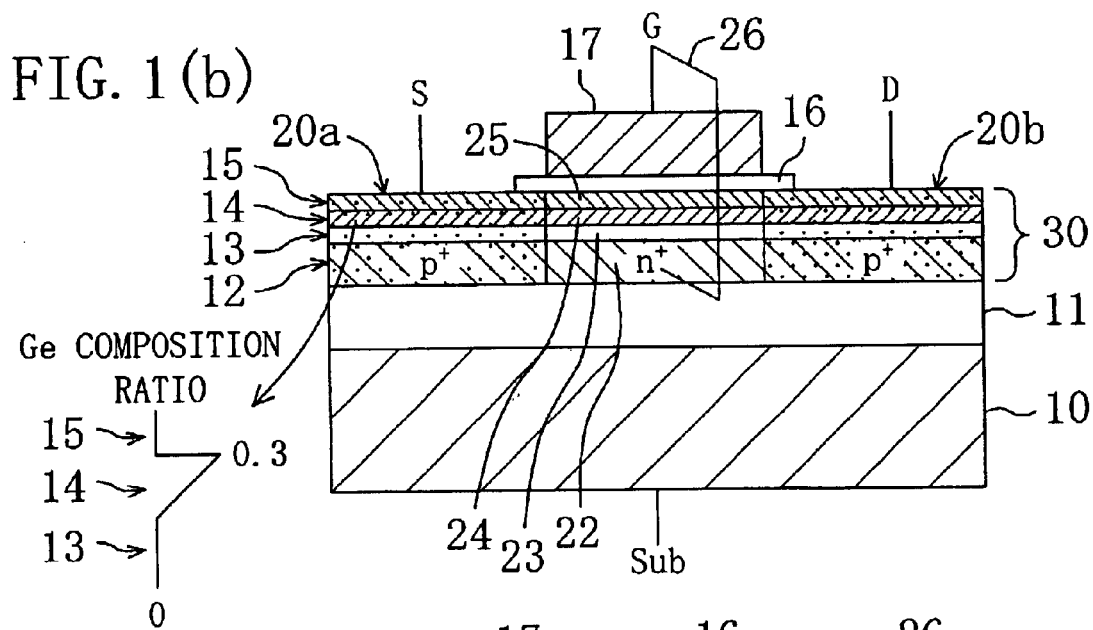
Figure 1C:
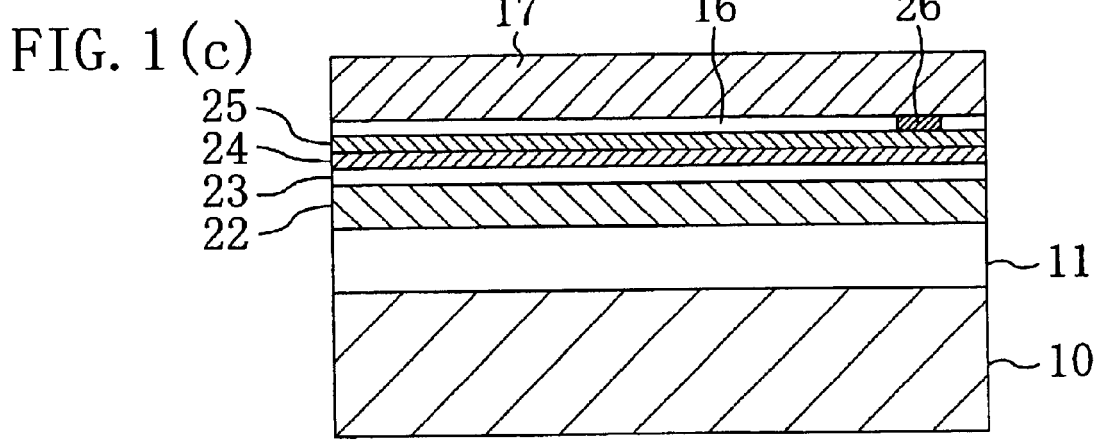

FIGS. 1(a), 1(b) and 1(c) are a plan view schematically showing a structure of a p-channel type graded SiGe-HDTMOS of this embodiment, a cross-sectional view on an Ib—Ib line shown in FIG. 1(a) and a cross-sectional view on an Ic—Ic line shown in FIG. 1(a), respectively. As shown in FIGS. 1(a) to 1(c), the graded SiGe-HDTMOS of this embodiment includes a p-type Si substrate 10, a buried oxide film 11 of approximately 100 nm in thickness formed using a method for implanting oxygen ions into an Si substrate, etc. and a semiconductor layer 30 provided on the buried oxide film 11. The semiconductor layer 30 is made up of an upper Si film 12 of approximately 100 nm in thickness making up the upper section of the SOI substrate, an Si buffer layer 13 of approximately 10 nm in thickness epitaxially grown on the upper Si film 12 using a UHV-CVD method, an $Si_{1-x}Ge_x$ film 14 of approximately 15 nm in thickness epitaxially grown on the Si buffer layer 13 using a UHV-CVD method and an Si cap layer 15 of approximately 5 nm in thickness epitaxially grown on the $Si_{1-x}Ge_x$ film 14 using a UHV-CVD method.

The HDTMOS is further provided with a gate insulating film 16 of approximately 6 nm in thickness made of a silicon oxide film provided on the Si cap layer 15 and a gate electrode 17 provided on the gate insulating film 16. Furthermore, there is a source region 20a and drain region 20b including high concentration p-type impurities in the regions located at both sides of the gate electrode 17 of the semiconductor layer 30, that is, the upper Si film 12, Si buffer layer 13, $Si_{1-x}Ge_x$ film 14 and Si cap layer 15. Furthermore, the region between the source region 20a and drain region 20b of the upper Si film 12 constitutes an Si body region 22 containing high concentration n-type impurities and the region directly above the Si body region 22 of the Si buffer layer 13 constitutes an n$^{--}$Si region 23 containing low concentration n-type impurities. The region between the source region 20a and drain region 20b of the $Si_{1-x}Ge_x$ film 14 constitutes an SiGe channel region 24 containing relatively low concentration n-type impurities and the region directly below the gate insulating film 16 of the Si film 15 constitutes an Si cap region 25 containing low concentration n-type impurities. Furthermore, there is a contact 26 which is a conductive member that electrically connects the gate electrode 17 and Si body region 22. By the way, the channel is approximately 0.3 μm long.

As shown on the left of FIG. 1(b) a feature of this embodiment is that the Ge composition ratio x of the $Si_{1-x}Ge_x$ film 14 has a graded composition that continuously changes from x=0 to x=0.3 from the Si buffer layer 13 to the Si cap layer 15.

Furthermore, n-type impurities are doped into the upper Si film 12 by means of ion implantation before crystal growth. When the Si buffer layer 13, $Si_{1-x}Ge_x$ film 14 and Si cap layer 15 are stack-deposited one atop another using a UHV-CVD method, an n-type impurity (e.g., arsenic) on the order of $5 \times 10^{16}$ atoms·cm$^{-3}$ is doped using an in-situ dope. Since the Ge composition changes continuously, the band gap of the $Si_{1-x}Ge_x$ film 14 is smaller than the band gap of Si on the boundary section with the Si cap layer 15 by approximately 220 meV. The difference of this band gap mostly appears as a band offset (hetero-barrier) in the valence band and a potential well is formed to confine holes in this hetero-barrier.

The composition ratio x of the $Si_{1-x}Ge_x$ film 14 is preferably within a range of $0<x\leq0.4$.

Relationship Between Structure of $Si_{1-x}Ge_x$ film and Substrate Current

Here, a difference in the substrate current between the graded composition SiGe-HDTMOS of this embodiment and uniform composition SiGe (box composition)-HDTMOS will be explained.

Figure 10A:
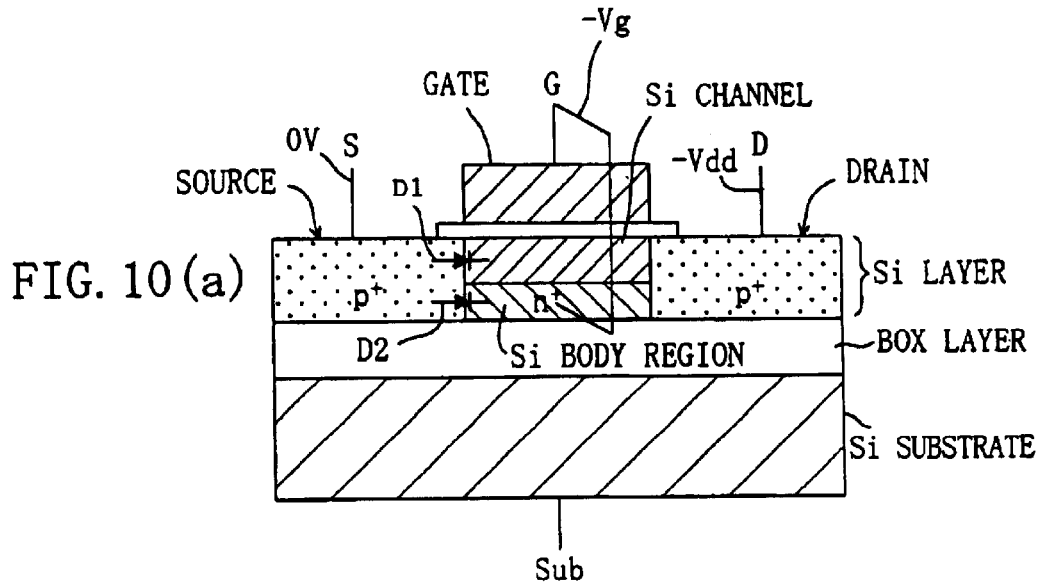
FIGS. 10(a) and 10(b) are cross-sectional views showing a parasitic diode in a DTMOS having a typical Si channel and a parasitic diode in a DTMOS having a uniform composition SiGe channel.
Figure 10B:
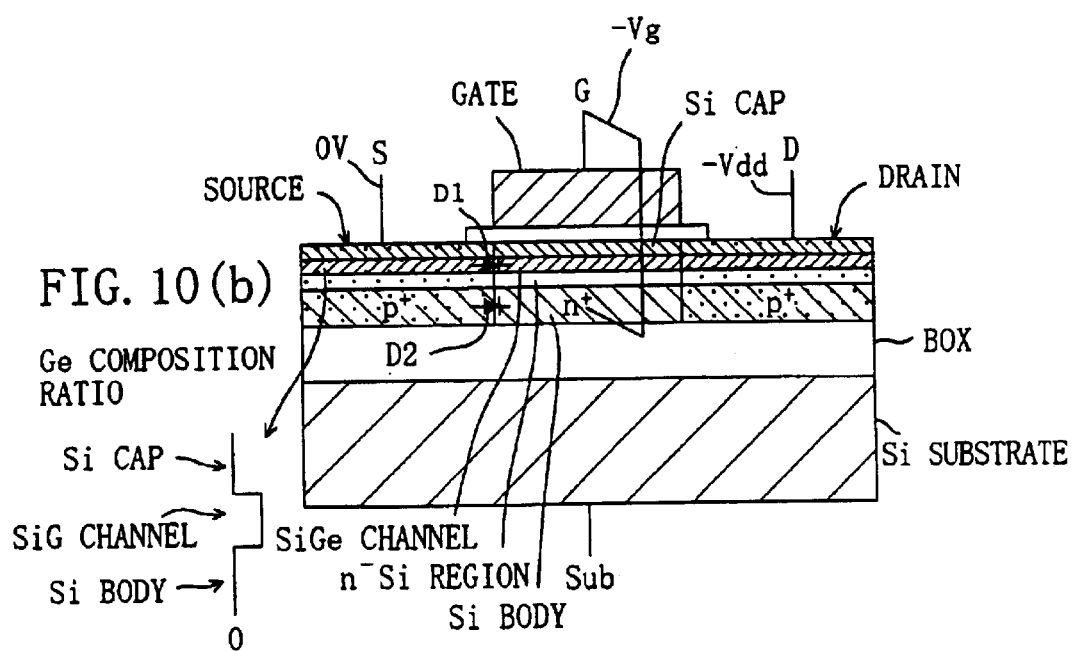

FIGS. 10(a) and 10(b) are cross-sectional views showing a parasitic diode in a DTMOS having a typical Si channel and a parasitic diode in an HDTMOS having a box composition SiGe film (hereinafter referred to as "box composition SiGe-HDTMOS").

In the DTMOS shown in FIG. 10(a), there are a source and drain containing a high concentration p-type impurity in an Si layer on a BOX layer, an Si body containing a high concentration n-type impurity and an Si channel containing a low concentration n-type impurity.

In the DTMOS, the gate electrode, channel and body are short-circuited and if a bias voltage is applied to the gate electrode in this condition, a forward bias voltage as high as the gate bias voltage is applied to the Si body and Si channel. When the gate bias is OFF, this creates the same condition as that of a normal MOS transistor and when the gate bias is ON, the body region is biased in the forward direction as the gate bias voltage increases, and therefore the threshold voltage decreases. Then, as shown in FIG. 10(a), when a voltage is applied between the source and drain, a first diode D1 is formed between the source and Si channel and a second diode D2 is formed between the source and Si body.

At this time, a reverse saturation current density Js1 per unit area of the first diode D1 is expressed by expression (1) below:

$$Js1 = q\{\sqrt{(Dp/\tau p)}\}(n_{i-Si}^2/Nd-) + q\{\sqrt{(Dn/\tau n)}\}(n_{i-Si}^2/Na) \quad (1)$$

where q is of the unit charge, Dp is a diffusion constant of holes, Dn is a diffusion constant of electrons, τp is hole lifetime, τn is electron lifetime, $n_{i-Si}$ is intrinsic carrier density, Nd– is donor concentration of the Si channel and Na is acceptor concentration of source/drain. The first term of the right side in expression (1) denotes a current by holes and the second term in the right side denotes a current by electrons.

The hole current shown in the first term of the right side in expression (1) flows into the drain without flowing into the Si body which is a high concentration n layer, and therefore it hardly contributes to the substrate current. On the other hand, the electron current shown in the second term of the right side in expression (1) also flows into the Si body, but the intrinsic carrier density $n_{i-Si}$ in the Si layer is small and the concentration Na of acceptors of the source and drain is large, and therefore, the electron current is as small as negligible.

On the other hand, the reverse saturation current density Js2 per unit area of the second diode D2 is expressed by expression (2) below:

$$Js2 = q\{\sqrt{(Dp/\tau p)}\}(n_{i-Si}^2/Nd+) + q\{\sqrt{(Dn/\tau n)}\}(n_{i-Si}^2/Na) \quad (2)$$

where Nd+ is donor concentration of the Si body and Na is acceptor concentration of source/drain. The first term of the right side in expression (2) denotes a current by holes and the second term in the right side denotes a current by electrons.

At this time, since Na>Nd+, the hole current shown in the first term of the right side in expression (2) is dominant, but if the impurity concentration of the Si body is increased, Nd+ increases, making it possible to control the hole current. On the other hand, the electron current shown in the second term of the right side in expression (2) also flows into the Si body, but the intrinsic carrier density $n_{i-Si}$ in the Si layer is small and the acceptor concentration of the source and drain is large, and therefore, the electron current is as small as negligible.

As a result, the DTMOS having the Si channel can suppress the overall substrate current (Js1+Js2) to a small value.

On the contrary, as shown in FIG. 10(b), in the case of a uniform composition SiGe-HDTMOS, when a voltage is applied between the source and drain, a first diode D1 is formed between the source and SiGe channel and a second diode D2 is formed between the source and Si body.

At this time, the reverse saturation current density Js1 per unit area of the first diode D1 is expressed by expression (3) below:

$$Js1 = q\{\sqrt{(Dp/\tau p)}\}(n_{i-SiGe}^2/Nd-) + q\{\sqrt{(Dn/\tau n)}\}(n_{i-SiGe}^2/Na) \quad (3)$$

where Nd− is donor concentration of the SiGe channel and Na is acceptor concentration of source/drain. The first term of the right side in expression (3) denotes a current by holes and the second term of the right side denotes a current by electrons.

The hole current flowing into the first diode D1 shown in the first term of the right side in expression (3) mostly flows into the drain without flowing into the Si body which is a high concentration n layer, and therefore it hardly contributes to the substrate current. On the other hand, the electron current that flows into the first diode D1 shown in the second term of the right side in expression (3) also flows into the Si body, but the intrinsic carrier density $n_{i-SiGe}$ in the SiGe layer is considerably large when compared to the Si layer, and therefore the electron current is not negligible.

On the other hand, the reverse saturation current density Js2 per unit area of the second diode D2 is expressed by expression (4) below:

$$Js2 = q\{\sqrt{(Dp/\tau p)}\}(n_{i-Si}^2/Nd+) + q\{\sqrt{(Dn/\tau n)}\}(n_{i-Si}^2/Na) \quad (4)$$

where Nd+ is donor concentration of the Si body and Na is acceptor concentration of source/drain. The first term of the right side in expression (4) denotes a current by holes and the second term in the right side denotes a current by electrons.

At this time, since Na>Nd+, the hole current shown in the first term of the right side in expression (4) is dominant, but if the impurity concentration of the Si body is increased, Nd+ increases, making it possible to control the hole current. On the other hand, the electron current shown in the second term of the right side in expression (4) also flows into the Si body, but the intrinsic carrier density $n_{i-Si}$ in the Si layer is small and the acceptor concentration of the source and drain is large, and therefore, the electron current is as small as negligible.

As shown above, since the SiGe-DTMOS having the SiGe channel cannot suppress the electron current in expression (3), it is difficult to suppress the overall substrate current (Js1+Js2) to a low value.

Compared to a typical DTMOS having an Si channel, the SiGe-DTMOS having the SiGe channel of the present invention reduces the band gap of the SiGe layer which is the channel layer by approximately 220 meV than Si by setting the content of Ge to 30% and the band gap difference appears as a hetero-barrier in the valence band which is advantageous in confining holes, and therefore it is possible to realize a low threshold value.

However, as shown above, in the case of a box composition type hetero-structure DTMOS, if the Ge composition ratio is increased, it is difficult to reduce the component of the electron current of the substrate current.

Figure 11:
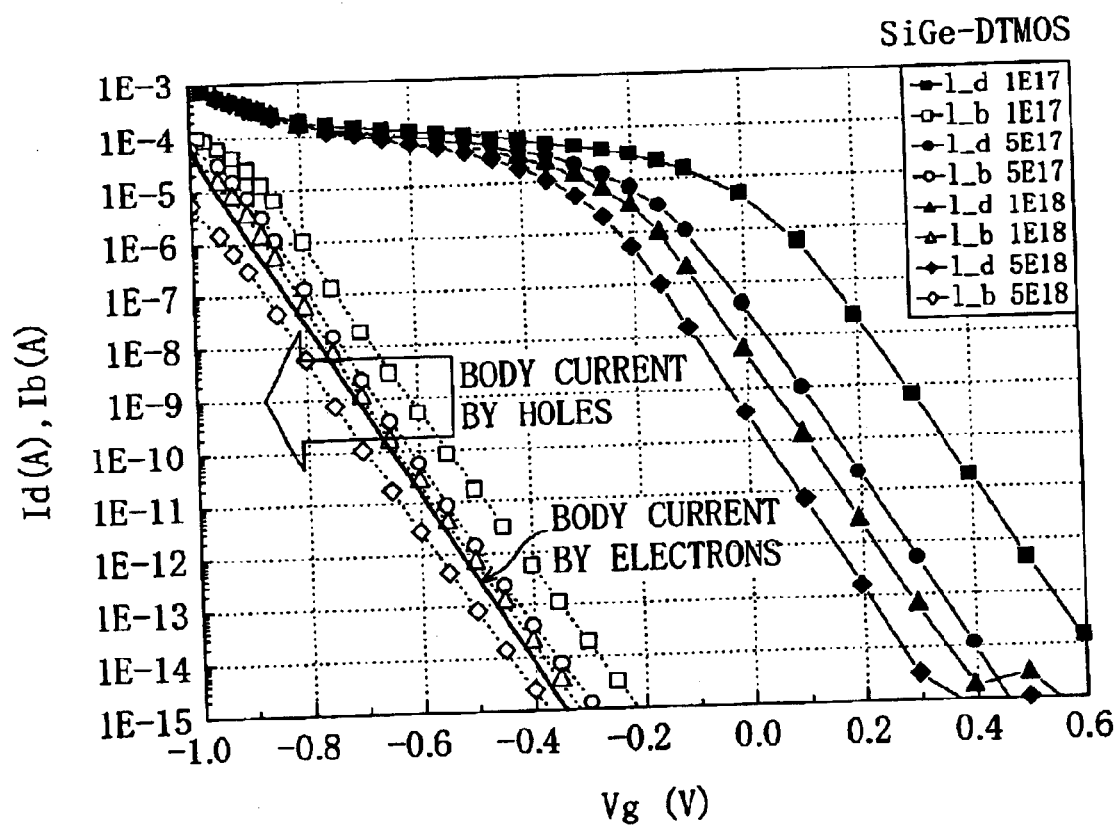
FIG. 11 shows simulation results of a drain current and gate bias dependency of a substrate current when concentration of impurities in the body region is changed in a box composition SiGe-HDTMOS.

FIG. 11 shows simulation results of gate bias dependency of a drain current Id and a substrate current Ib when concentration of impurities in the body region is changed in a box composition SiGe-HDTMOS. This simulation assumes that the thickness of the Si buffer layer is 10 nm, the thickness of the SiGe film is 15 nm, the thickness of the Si cap layer is 5 nm, the thickness of the gate oxide film is 6 nm, and the Ge composition of the SiGe channel layer is fixed to 30% and the channel is 0.3 µm long. That is, the thickness of each layer and channel layer are the same as those of the graded composition SiGe-HDTMOS of this embodiment. As shown in FIG. 11, even if the impurity concentration of the body region changes, the gate bias dependency property of the electron current hardly changes. On the other hand, if the impurity concentration of the body region increases, the overall hole current decreases. That is, since the impurity concentration of the source region is as high as approximately $1\times10^{20}$ atoms·cm$^{-3}$, the hole current that flows into the second diode D2 between the source and body is essentially dominant. Thus, it is possible to suppress the hole current by increasing the impurity concentration of the body region.

However, even if the impurity concentration of the body region changes, the gate-bias dependency property of the electron current of the substrate current hardly changes, and therefore a lower limit of the substrate current is determined by the electron current and the substrate current cannot be reduced to this lower limit or below. In this way, when the impurity concentration of the body region of the box composition SiGe-HDTMOS exceeds $1\times10^{18}$ atoms·cm$^{-3}$, the electron current becomes dominant and it is no longer possible to suppress the substrate current even if the impurity concentration of the body region is increased. As a result, there is a limit to the expansion of the operating voltage range.

Figure 12:
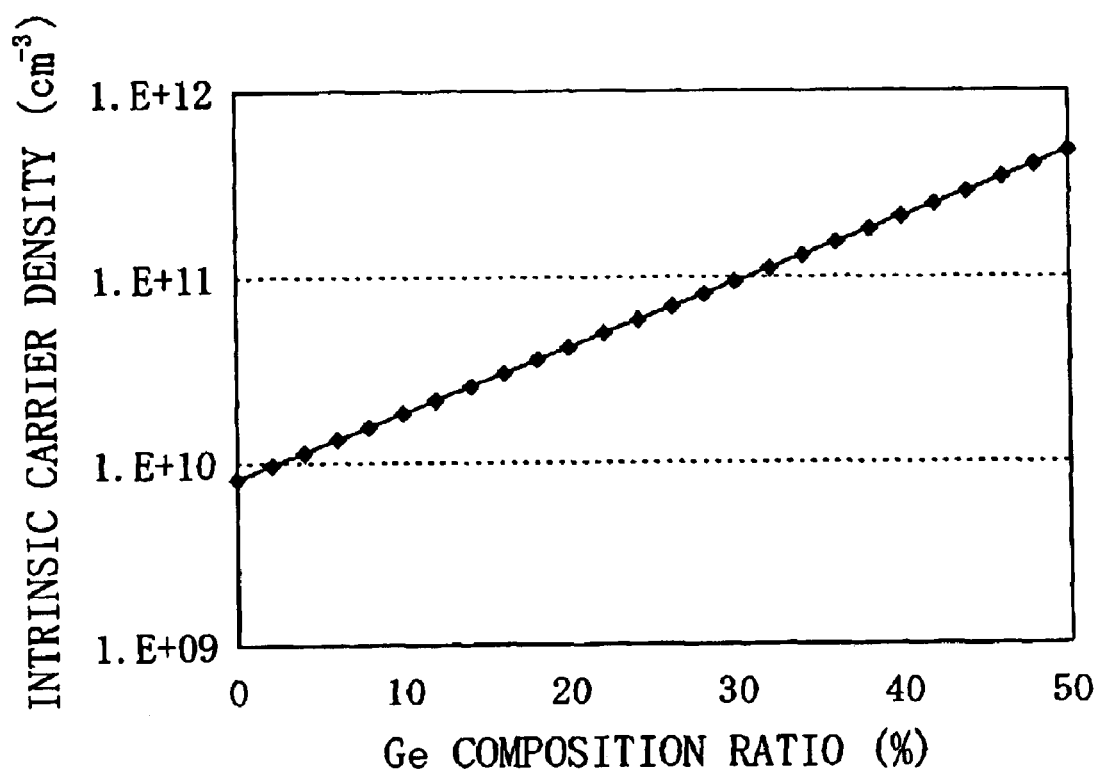
FIG. 12 illustrates Ge composition ratio dependency of intrinsic carrier density of SiGe.

FIG. 12 illustrates Ge composition ratio dependency of intrinsic carrier density of SiGe. As shown in FIG. 12, the intrinsic carrier density of SiGe whose Ge composition ratio is 30% reaches a value approximately 10 times that of Si. For this reason, as described above, it is difficult to effectively reduce the component corresponding to the second term of the right side in expression (3), that is, the electron current component of the substrate current.

On the other hand, since the SiGe channel region 24 of the SiGe-HDTMOS of this embodiment has a graded composition, if the peak concentration is set to 30%, the average Ge composition ratio becomes approximately 15%. In this case, as is apparent from FIG. 12, the average intrinsic carrier density $n_{i-SiGe}$ of the channel region increases only about 2.5 times that of Si, and therefore the electron current in expression (3) is suppressed to a negligible level. However, if the threshold voltage increases up to a level of Si-DMOS by adopting a graded composition, the provision of heterojunction becomes meaningless.

Figure 2:
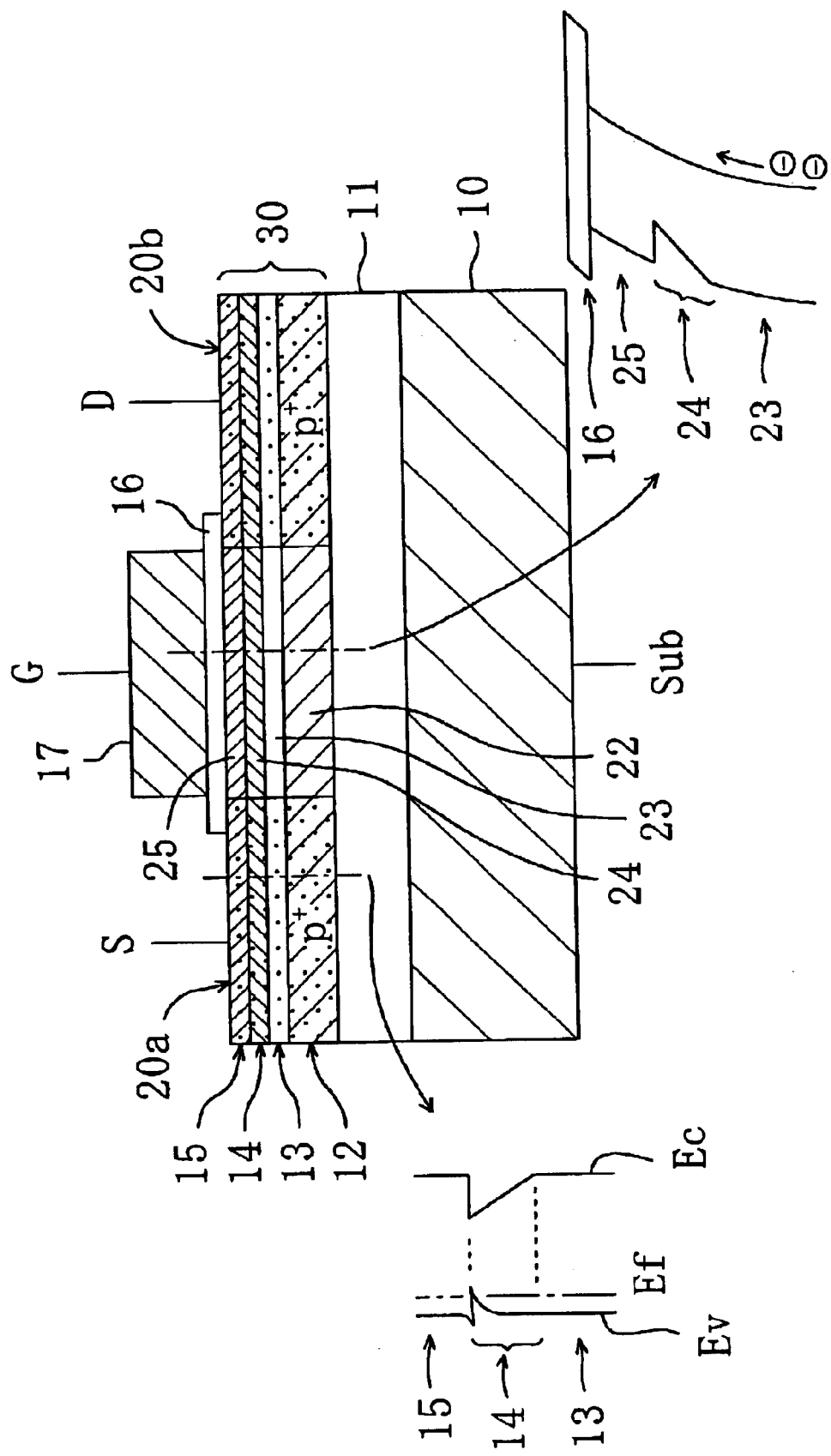
FIG. 2 is a cross-sectional view showing a band structure of the source region of the graded composition SiGe-HDTMOS and behavior of electrons according to a first embodiment.

FIG. 2 is a cross-sectional view showing a band structure of the source region of the graded composition SiGe-HDTMOS of this embodiment. By introducing a graded composition to the SiGe film, with regard to the built-in potential condition shown on the left side of FIG. 2, the conduction band potential well of the source region 20a of the $Si_{1-x}Ge_x$ film 14 is shallow on the Si buffer layer 13 side and deep on the Si cap layer 15 side. Furthermore, since the p-channel of the SiGe-HDTMOS is formed in a region contacting the Si cap region 25 of the SiGe channel region 24, if the Ge composition ratio around this region is 30%, it is possible to secure a low threshold voltage almost equivalent to that of the SiGe channel with a uniform composition whose Ge composition ratio is 30%.

Therefore, providing the graded composition SiGe channel region 24 makes it possible to suppress the substrate current to a small value while taking advantage of the HDTMOS having a low threshold and thereby expand the operable range.

Another Concept of Substrate Current Suppression Effect

Figure 13:
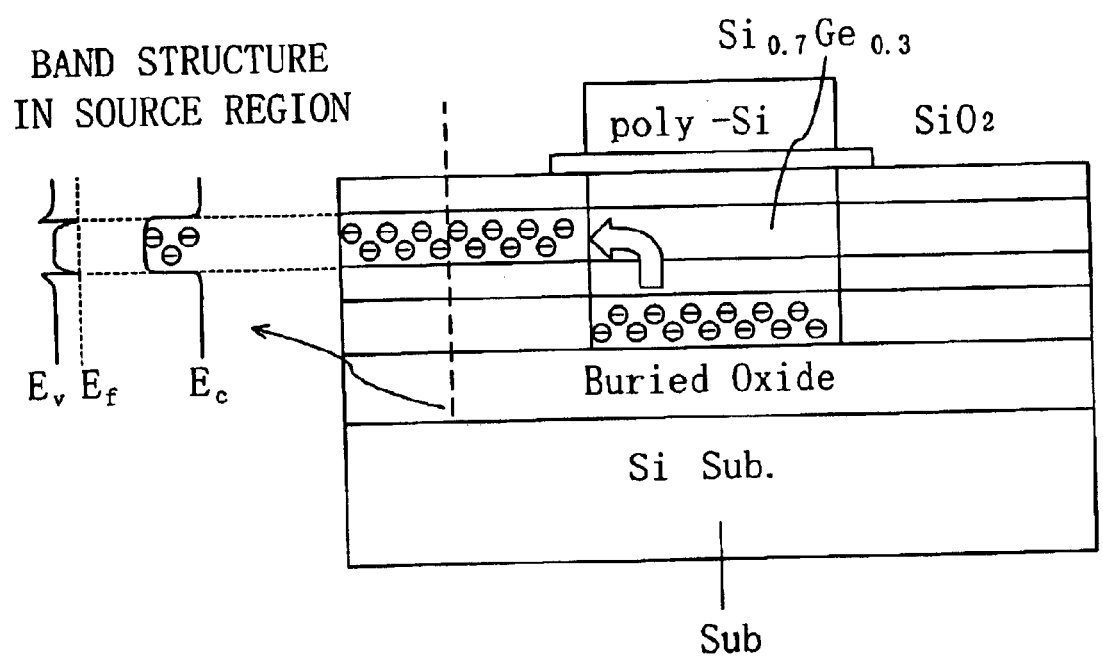
FIG. 13 is a cross-sectional view showing a structure of HDTMOS provided with a SiGe film having a box composition and behavior of electrons.

FIG. 13 is a cross-sectional view showing a structure of the box composition SiGe-HDTMOS and behavior of electrons. In the box composition SiGe-HDTMOS shown in FIG. 13, the impurity concentration in the source region is set to as high as $1\times10^{20}$ atoms·cm$^{-3}$, and therefore the Si cap, SiGe channel and Si body have the same Fermi level and a pseudo potential well is thereby generated on the conduction band side. Both the Si body and SiGe channel are n-type layers and since the Si body contains a higher concentration n-type impurity, electrons flow easily from the Si body to the SiGe channel. On the other hand, the SiGe channel of the SiGe film is a low concentration n-type region and the source is a high concentration p-type region, and therefore a PN junction is formed between these regions and a first diode D1 exists. Thus, it may also be conceivable that electrons flow from the Si body to the SiGe channel with a forward voltage between the Si body and body/source and these electrons are drawn by the source.

On the other hand, as shown in FIG. 2, the conduction band potential well of the source region 20a of the $Si_{1-x}Ge_x$ film 14 of the SiGeHDTMOS of this embodiment is shallow on the Si buffer layer 13 side and deep on the Si cap layer 15 side. Furthermore, electrons in the body region try to flow into the deep part of the potential well, but since the distance from the n-type body region where a large quantity of electrons exists to the deep part of the potential well increases, it is also possible to think that drawing of electrons hardly takes place. That is, as shown on the right side of FIG. 2, the band at the edge of the conduction band on the longitudinal cross section that passes through the gate electrode 17 is bent by the built-in potential, and therefore it is also conceivable that the fact that the obstacle against the movement of electrons grows as the distance from the $n^{--}Si$ region 23 increases may contribute to a reduction of the electron current. Thus, when the electron current reduces, the substrate current further reduces to a level lower than the lower limit of the box composition SiGe-HDTMOS.

Though which of the above described two actions mainly contributes to the electron current reduction is not confirmed, the graded composition SiGe-HDTMOS of this embodiment produces the following effects.

Figure 3:
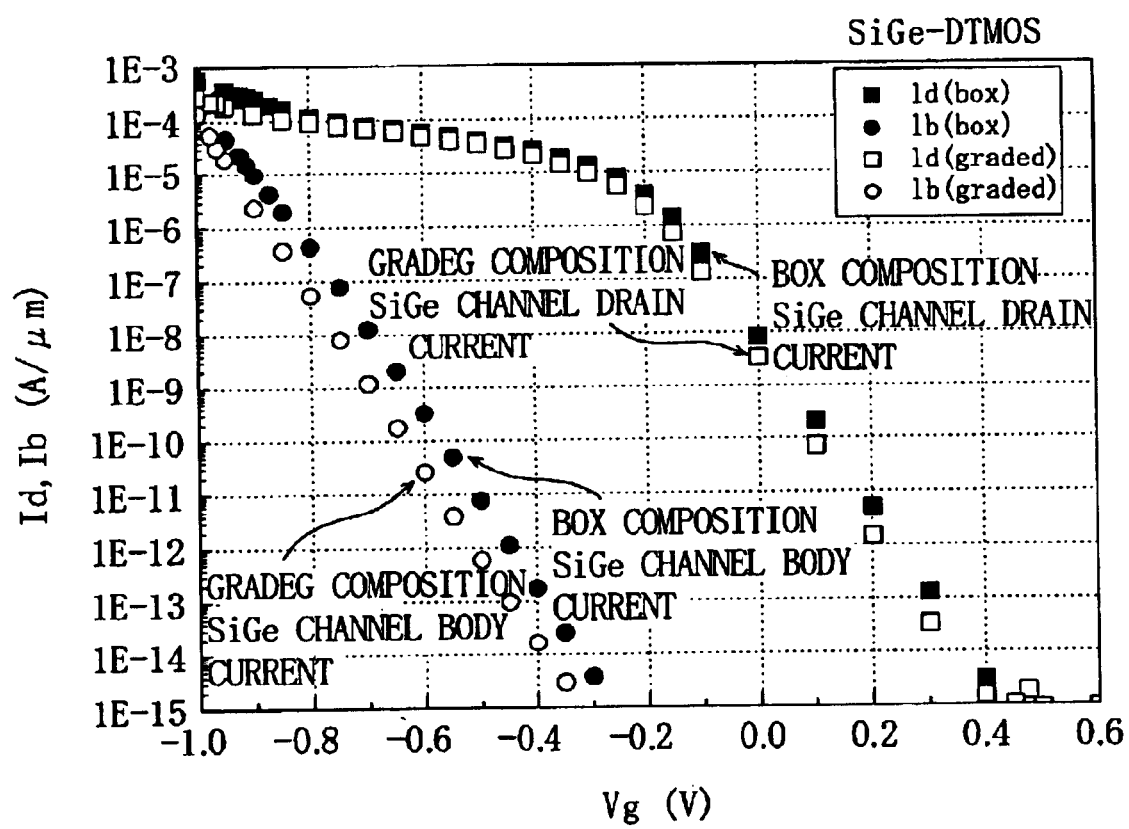
FIG. 3 illustrates simulation results of a Vg-Id characteristic and Vg-Ib characteristic of a box-composition SiGe-HDTMOS and graded composition SiGe-HDTMOS.

FIG. 3 illustrates simulation results of a Vg-Id characteristic and Vg-Ib characteristic of box composition SiGe-HDTMOS and graded composition SiGe-HDTMOS. As shown in FIG. 3, it is confirmed that the graded composition SiGe-HDTMOS can increase the impurity concentration in the body region, reduce the hole current and at the same time reduce the electron current, and thereby reduce the overall substrate current of holes and electrons by about an order of magnitude. On the other hand, compared to the box composition SiGe-HDTMOS, the drain current Id has not been reduced so much.

Thus, the above described two actions can be considered as the cause for such an effect and as a result of the substrate current being suppressed by the graded composition SiGe-HDTMOS of this embodiment, it is confirmed that the operating voltage range has expanded to about 0.05 V to 0.08 V.

This embodiment has described the HDTMOS having an Si/SiGe/Si hetero-structure as an example, but the same is also applicable to other semiconductor materials.

By the way, this embodiment has explained the SiGe-HDTMOS formed on an SOI substrate whose insulating layer (BOX layer) exists below the semiconductor layer, but SiGe-HDTMOS of the present invention can also demonstrate the same effects as those of this embodiment even if a bulk substrate such as bulk silicon substrate is used as the semiconductor substrate.

It is also possible to provide an SiGeC channel region containing trace C (e.g., 0.02 to 1.0%) and having a graded Ge composition ratio instead of the SiGe channel region 24 of this embodiment. In that case, too, it is possible to suppress the current component of the substrate current to a low level while maintaining the low threshold by including the graded composition SiGeC channel region, thus demonstrating the same effects as those of this embodiment.

Second Embodiment

A second embodiment will describe an HDTMOS using an SiC having a graded composition as the material for making up the channel region and using an Si/SiC heterojunction (hereinafter referred to as "graded composition SiC-HDTMOS").

Figure 4:
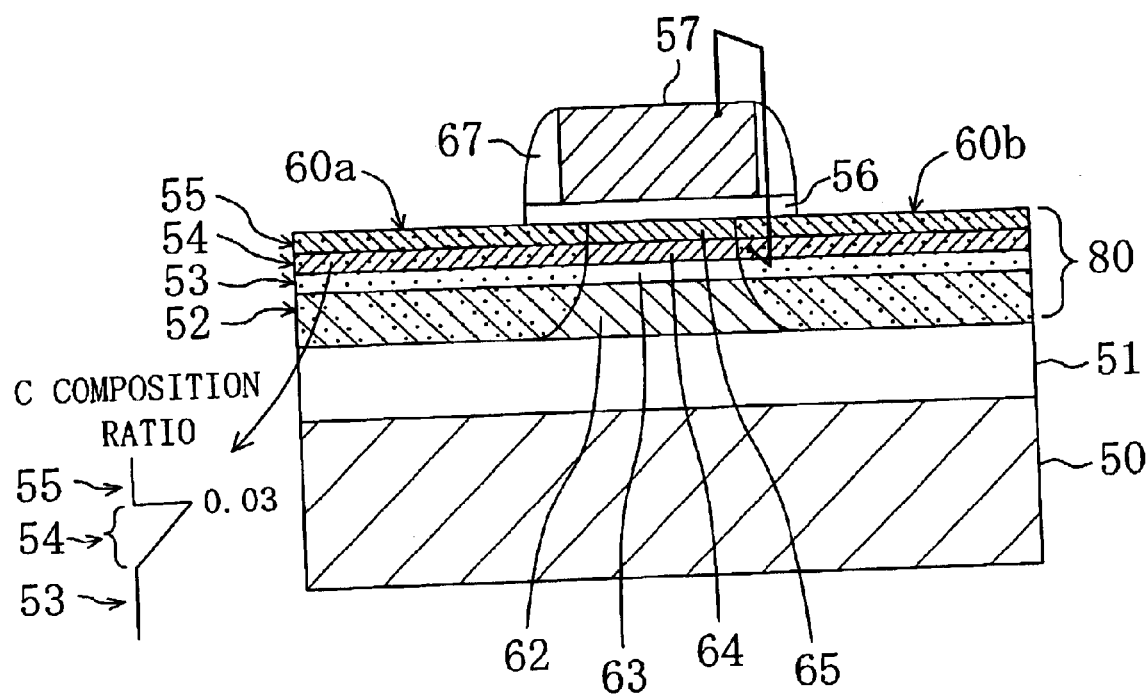
FIG. 4 is a schematic cross-sectional view of a structure of an n-channel type graded SiC-HDTMOS according to a second embodiment.

FIG. 4 is a schematic cross-sectional view of a structure of an n-channel type graded SiC-HDTMOS according to this embodiment. As shown in FIG. 4, the graded SiC-HDTMOS of this embodiment includes a p-type Si substrate 50, a buried oxide film 51 of approximately 100 nm in thickness formed using a method for implanting oxygen ions into an Si substrate, etc. and a semiconductor layer 80 provided on the buried oxide film 51. The semiconductor layer 80 is made up of an upper Si film 52 of approximately 100 nm in thickness making up the upper section of the SOI substrate, an Si buffer layer 53 of approximately 10 nm in thickness epitaxially grown on the upper Si film 52 using a UHV-CVD method, an $Si_{1-y}C_y$ film 54 of approximately 15 nm in thickness epitaxially grown on the Si buffer layer 53 using a UHV-CVD method and an Si cap layer 55 of approximately 5 nm in thickness epitaxially grown on the $Si_{1-y}C_y$ film 54 using a UHV-CVD method.

The HDTMOS is further provided with a gate insulating film 56 of approximately 6 nm in thickness made up of a silicon oxide film provided on the Si cap layer 55 and a gate electrode 57 provided on the gate insulating film 56. Furthermore, there are a source region 60a and drain region 60b containing high concentration n-type impurities in the regions located at both sides of the gate electrode 57 of the semiconductor layer 80, that is, the upper Si film 52, Si buffer layer 53, $Si_{1-y}C_y$ film 54 and Si cap layer 55. Furthermore, the region between the source region 60a and drain region 60b of the upper Si film 52 constitutes an Si body region 62 containing high concentration p-type impurities and the region directly above the Si body region 62 of the Si buffer layer 53 constitutes a p⁻Si region 63 containing low concentration p-type impurities. The region between the source region 60a and drain region 60b of the $Si_{1-y}C_y$ film 54 constitutes an SiC channel region 64 containing relatively low concentration p-type impurities and the region directly below the gate insulating film 56 of the Si film 55 constitutes an Si cap region 65 containing low concentration p-type impurities. Furthermore, there is a contact 66 (having the same cross-sectional structure as the cross-sectional structure shown in FIG. 1(c)) which is a conductive member that electrically connects the gate electrode 57 and Si body region 62. By the way, the channel is approximately 0.3 μm long.

As shown on the left of FIG. 4, a feature of this embodiment is that the C composition ratio y of the $Si_{1-y}C_y$ film 54 has a graded composition that continuously changes from y=0 to y=0.03 from the Si buffer layer 53 to the Si cap layer 55.

Furthermore, p-type impurities are doped into the upper Si film 52 by means of ion implantation before crystal growth. When the Si buffer layer 53, $Si_{1-y}C_y$ film 54 and Si cap layer 55 are stack-deposited one atop another using a UHV-CVD method, a p-type impurity (e.g., boron) on the order of $5 \times 10^{16}$ atoms·cm⁻³ is doped using an in-situ dope. Since the C composition changes continuously, the band gap of the $Si_{1-y}C_y$ film 54 is smaller than the band gap of Si on the boundary section with the Si cap layer 55. The difference of this band gap mostly appears as a band offset (heterobarrier) in the valence band and a potential well is formed to confine holes in this hetero-barrier.

The C composition ratio y of the $Si_{1-y}C_y$ film is preferably within a range of $0 < y \leq 0.03$.

Relationship Between Structure of $Si_{1-y}C_y$ Film and Substrate Current

Here, a difference in the substrate current between the graded composition SiC-HDTMOS of this embodiment and (box composition) HDTMOS with no graded composition will be explained.

As will be easily appreciated if explanations based on FIGS. 10(a) and 10(b) are applied with the conductive types switched around, expressions with reversed conductive types of expressions (3) and (4) are obtained for the n-channel type HDTMOS. Then, the component corresponding to the first term of the right side in expression (3) becomes an electron current and the component corresponding to the second term of the right side in expression (3) represents a hole current. Furthermore, it is not possible for the HDTMOS having a box composition SiC film (hereinafter referred to as "box composition SiC-HDTMOS") to realize a lower threshold voltage unless the C composition ratio is increased, and therefore the C composition ratio of the $Si_{1-y}C_y$ film is increased. However, if the C composition ratio of the $Si_{1-y}C_y$ film is increased, the band gap becomes narrower, and therefore the intrinsic carrier density of the SiC channel increases as shown in FIG. 12 and the hole current which is the component corresponding to the second term of the right side in expression (3) becomes too high to be negligible.

On the contrary, according to the SiC-HDTMOS of this embodiment, since the SiC channel region 64 has a graded composition, even if the average C composition ratio is decreased (e.g., on the order of 0.7%), the peak concentration of the C composition ratio can be increased (e.g., 1.4%), it is possible to suppress the hole current. That is, the SiC-HDTMOS of this embodiment makes it possible to suppress the substrate current while realizing a low threshold value and expand the operable range.

Furthermore, the above described effect can also be considered attributable to the following action. With the box composition SiC-HDTMOS, the impurity concentration of the source region is set to as high as approximately $1 \times 10^{20}$ atoms·cm⁻³, and therefore the Si cap, SiC channel and Si body have the same Fermi level and a pseudo potential well is thereby generated on the conduction band side. Both the Si body and SiC channel are p-type layers and since the Si body contains a higher concentration p-type impurity, holes flow easily from the Si body to the SiGe channel. On the other hand, the SiGe channel region of the SiGe film is a low concentration p-type region and the source region is a high concentration n-type region, and therefore a PN junction is formed between these regions. That is, there is almost no potential difference between the bottom of the potential well formed in the source region of the SiGe film and the edge of the conduction band of the SiGe channel region. Thus, there is a possibility that electrons will be drawn from the SiGe channel region to the source region by a forward voltage between the body and source.

Figure 5:
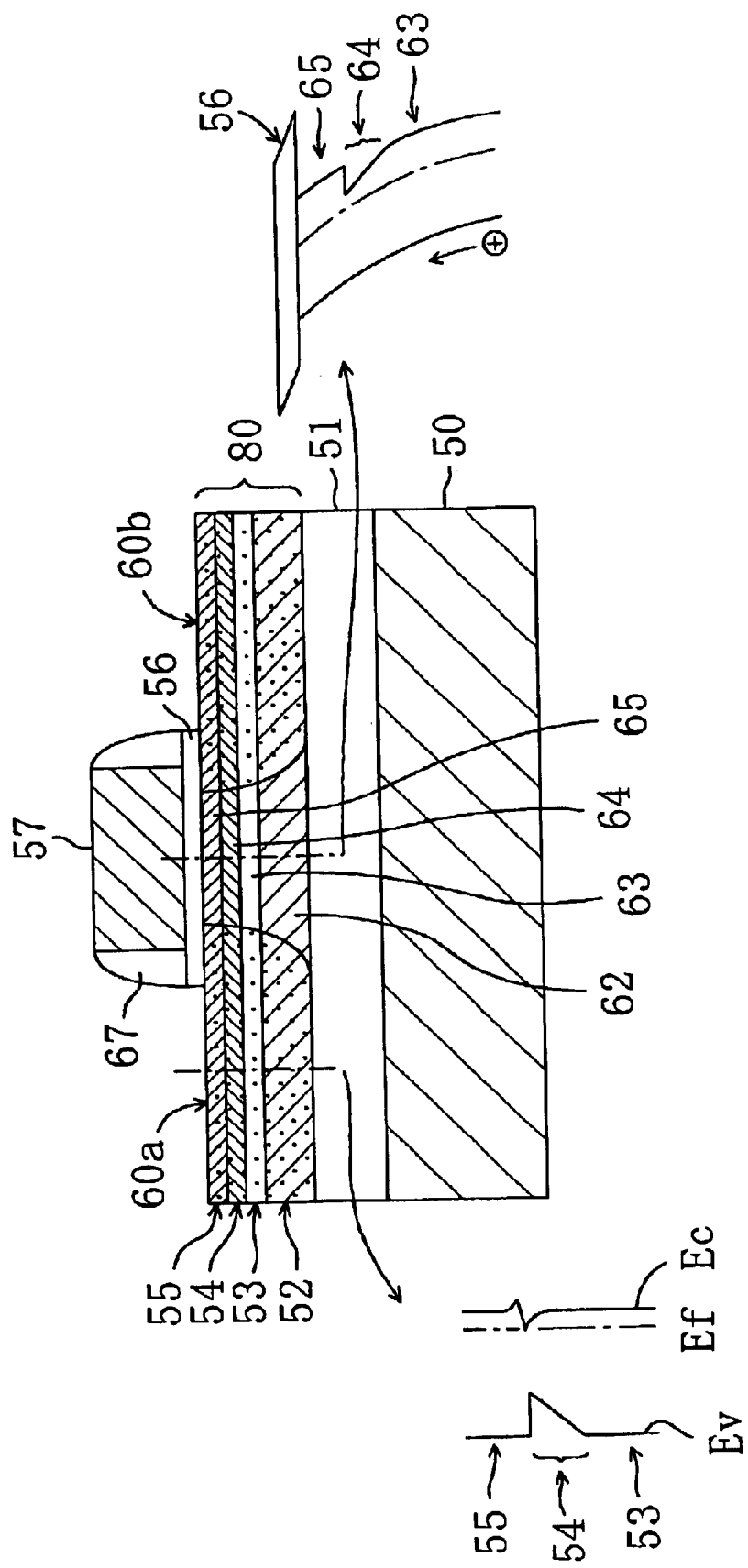
FIG. 5 is a cross-sectional view showing a band structure of the source region of the graded composition SiC-HDTMOS and behavior of electrons according to the second embodiment.

FIG. 5 is a cross-sectional view showing a band structure of the source region of the graded composition SiC-HDTMOS and behavior of electrons according to this embodiment. By introducing the graded composition to the SiC film, as shown on the left of FIG. 5, the conduction band potential well of the source region 60a of the $Si_{1-y}C_y$ film 54 is shallow on the Si buffer layer 53 side and deep on the Si cap layer 55 side. Furthermore, holes in the body region try to flow into the deep part of the potential well, but since the distance from the p-type body region where a large quantity of holes exists to the deep part of the potential well increases (distance of approximately 25 nm, which is the sum of the film thickness of the SiC channel layer and Si buffer layer), it is also possible to think that drawing of holes hardly takes place. Furthermore, by reducing the hole current, it is possible to reduce the substrate current below the lower limit of the box composition SiC-HDTMOS.

As described above, the SiC-HDTMOS of this embodiment introduces the graded composition type SiC channel, and can thereby suppress the hole current and expand the operating voltage range.

As shown above, the first and second embodiments have described embodiments of a semiconductor device made up of a silicon substrate, but the same discussion is also applicable to a hetero-structure DTMOS using other semiconductor materials. That is, by providing a graded composition channel region, the p-type hetero-structure DTMOS can suppress the electron current component of the substrate current, while the n-type hetero-structure DTMOS can suppress the hole current component of the substrate current.

Furthermore, this embodiment has described the SiC-HDTMOS formed on an SOI substrate including an insulating layer (BOX layer) below the semiconductor layer, but the SiC-HDTMOS of the present invention can also demonstrate similar effects as those of this embodiment even if a bulk substrate such as a bulk silicon substrate is used as the semiconductor substrate.

Furthermore, instead of the SiC channel region 24 of this embodiment, it is also possible to provide an SiGeC channel region including Ge (e.g., 5 to 35%) and having a graded C composition ratio. In that case, too, having a graded composition SiGeC channel region makes it possible to maintain a low threshold and suppress the current component of the substrate current to a low value, demonstrating the same effects as those of this embodiment.

Third Embodiment

A third embodiment will describe an HDTMOS using an SiGe having a graded composition as the material for making up the channel region and using an Si/SiGe heterojunction and an undoped Si buffer layer (hereinafter referred to as "graded composition SiGe-HDTMOS").

Figure 6:
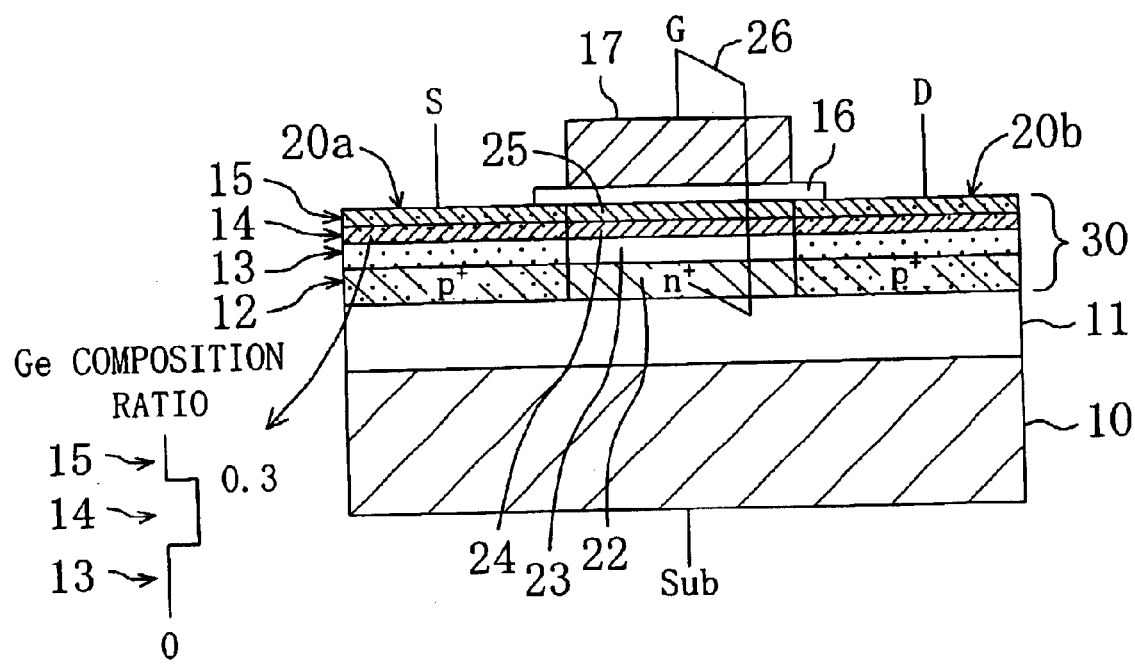
FIG. 6 is a cross-sectional view of a structure of a p-channel type graded SiGe-HDTMOS according to a third embodiment.

FIG. 6 is a schematic cross-sectional view of a structure of p-channel type graded SiGe-HDTMOS according to this embodiment. As shown in FIG. 6, the graded SiGe-HDTMOS of this embodiment includes a p-type Si substrate 10, a buried oxide film 11 of approximately 100 nm in thickness formed using a method for implanting oxygen ions into an Si substrate, etc. and a semiconductor layer 30 provided on the buried oxide film 11. The semiconductor layer 30 is made up of an upper Si film 12 of approximately 100 nm in thickness making up the upper section of the SOI substrate, an undoped Si buffer layer 33 of approximately 30 nm in thickness epitaxially grown on the upper Si film 12 using a UHV-CVD method, an $Si_{1-x}Ge_x$ film 14 of approximately 15 nm in thickness epitaxially grown on the undoped Si buffer layer 33 using a UHV-CVD method and an Si cap layer 15 of approximately 5 nm in thickness epitaxially grown on the $Si_{1-x}Ge_x$ film 14 using a UHV-CVD method.

The HDTMOS is further provided with a gate insulating film 16 of approximately 6 nm in thickness made of a silicon oxide film provided on the Si cap layer 15 and a gate electrode 17 provided on the gate insulating film 16. Furthermore, there are a source region 20a and drain region 20b containing high concentration p-type impurities in the region located at both sides of the gate electrode 17 of the semiconductor layer 30, that is, the upper Si film 12, undoped Si buffer layer 33, $Si_{1-x}Ge_x$ film 14 and Si cap layer 15. Furthermore, the region between the source region 20a and drain region 20b of the upper Si film 12 constitutes an Si body region 22 containing high concentration n-type impurities and the region directly above the Si body region 22 of the undoped Si buffer layer 33 constitutes an $n^{--}Si$ buffer region 35 containing extremely low concentration n-type impurities. The region between the source region 20a and drain region 20b of the $Si_{1-x}Ge_x$ film 14 constitutes an SiGe channel region 24 containing relatively low concentration n-type impurities and the region directly below the gate insulating film 16 of the Si cap layer 15 constitutes an Si cap region 25 containing low concentration n-type impurities. Furthermore, there is a contact 26 which is a conductive member that electrically connects the gate electrode 17 and Si body region 22. By the way, the channel is approximately 0.3 μm long.

As shown on the left of FIG. 6, a feature of this embodiment is that the Ge composition ratio x of the $Si_{1-x}Ge_x$ film 14 has a graded composition that continuously changes from x=0 to x=0.3 from the undoped Si buffer layer 33 to the Si cap layer 15 and that the $n^{--}Si$ buffer region 35 of approximately 30 nm in thickness is provided below the SiGe channel region 24.

Furthermore, n-type impurities are doped into the upper Si film 12 by means of ion implantation before crystal growth. No impurity is doped in the undoped Si buffer layer 33 during epitaxial growth by means of a UHV-CVD method. On the other hand, when the $Si_{1-x}Ge_x$ film 14 and Si cap layer 15 are stack-deposited one atop another using a UHV-CVD method, an n-type impurity (e.g., arsenic) on the order of $5 \times 10^{16}$ atoms·cm$^{-3}$ is doped using an in-situ dope. Since the Ge composition changes continuously, the band gap of the $Si_{1-x}Ge_x$ film 14 is smaller than the band gap of Si on the boundary section with the Si cap layer 15 by approximately 220 meV. The difference of this band gap mostly appears as a band offset (hetero-barrier) in the valence band and a potential well is formed to confine holes in this hetero-barrier.

Relationship Between Structure of $Si_{1-x}Ge_x$ Film and Substrate Current

Figure 7:
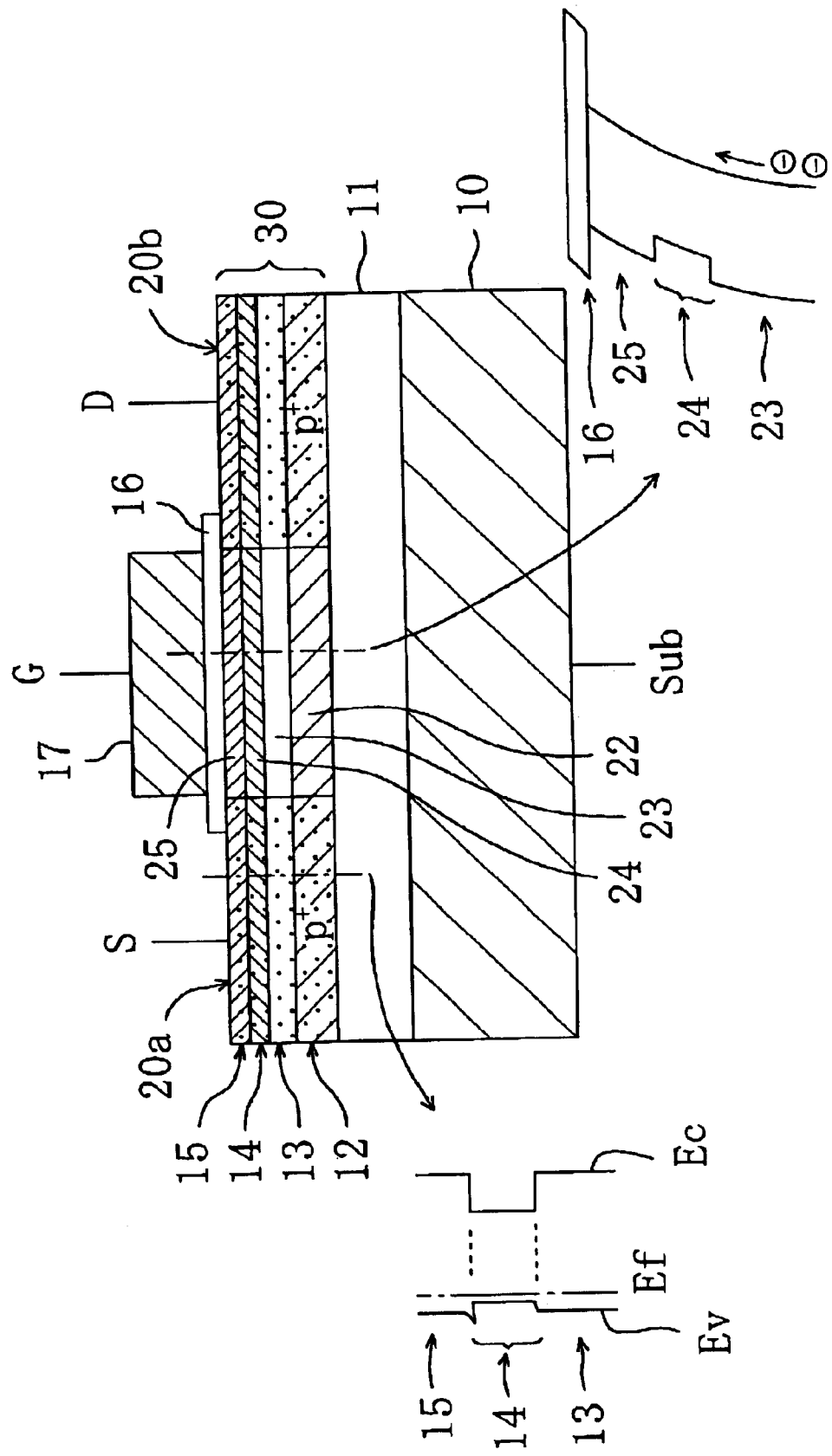
FIG. 7 is a cross-sectional view showing a band structure of each component and behavior of electrons on a cross section that passes through the gate electrode of the graded composition SiGe-HDTMOS having an undoped Si buffer region according to the third embodiment.

FIG. 7 is a cross-sectional view showing a band structure of each component and behavior of electrons on a cross section that passes through the gate electrode of the graded composition SiGe-HDTMOS having the undoped Si buffer region of this embodiment. As shown in FIG. 7, when attention is focused on the band structure in the region located below the gate electrode 17 within the semiconductor layer 30, the built-in voltage between the gate electrode 17 and body region is applied to the undoped Si buffer layer 33, and therefore if the thickness of the undoped Si buffer layer 33 is increased, the curvature of the band in the undoped Si buffer layer 33 increases as shown on the left of FIG. 7.

Figure 8:
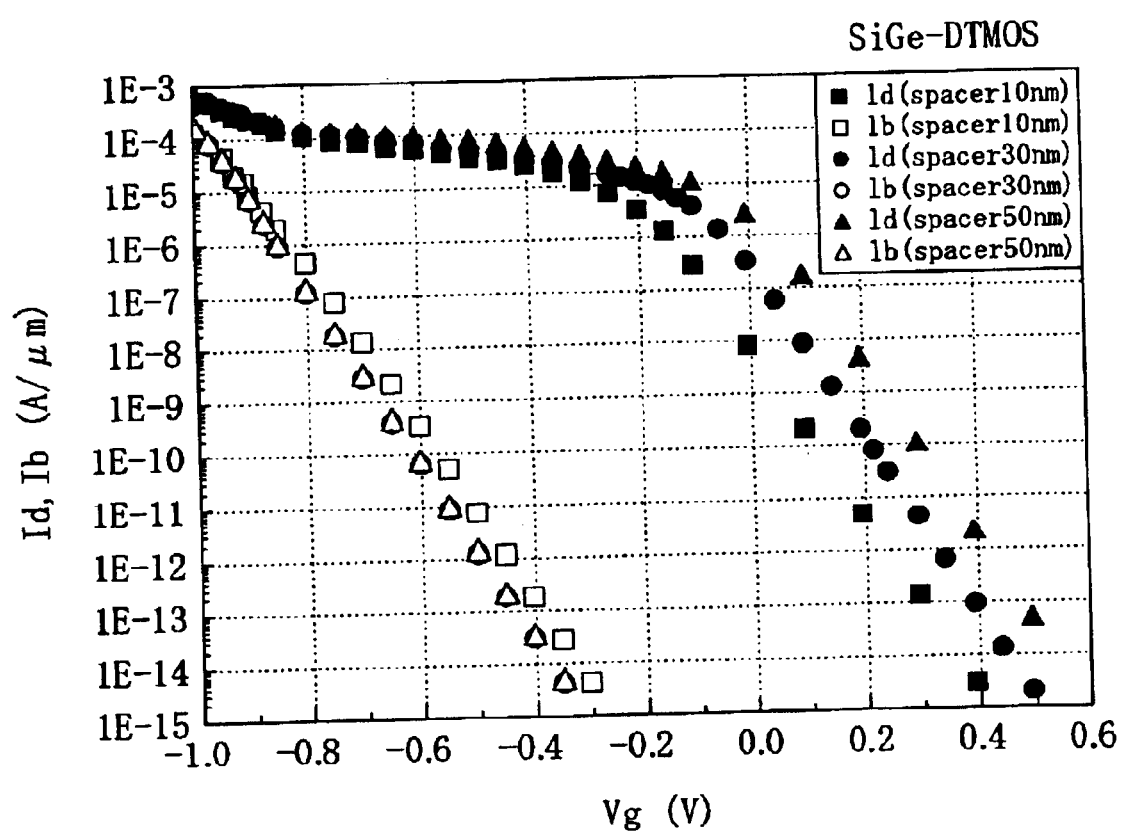
FIG. 8 illustrates simulation results of a Vg-Id characteristic and Vg-Ib characteristic when the thickness of the undoped Si buffer layer is changed.

FIG. 8 illustrates simulation results of a Vg-Id characteristic and Vg-Ib characteristic when the thickness of the undoped Si buffer layer 33 is changed to 10 nm, 30 nm and 50 nm. As shown in FIG. 8, it is observed that the substrate current Ib of the samples of the undoped Si buffer layer 33 of 30 nm and 50 nm in thickness is smaller than the substrate current Ib of the sample of the undoped Si buffer layer 33 of 10 nm in thickness.

This data may be considered attributable to the following action. That is, as shown in FIG. 7, the curvature of the band of the undoped Si buffer layer 33 produces a barrier against the movement of electrons from the body region. Then, as described above, increasing the thickness of the undoped Si buffer layer 33 in such a way as to exceed 10 nm possibly prevents electrons from being drawn from the body region to the potential well at the edge of the conduction band formed on the SiGe film 14 of the source region 20a, and consequently reduces the substrate current Ib.

Furthermore, for these reasons, it is reasonable to estimate that in the first and second embodiments, two actions are involved; one action whereby the substrate current is suppressed by a reduction of the current (component corresponding to the second term of the right side in expression (3)) caused by a reduction of the average composition ratio of the channel region by providing a graded composition channel region and the other action whereby the substrate current is suppressed by a reduction of carriers drawn from the body region to the source through the channel region.

Furthermore, as shown in the same figure, the drain current Id increases as the thickness of the undoped Si buffer layer 33 increases within the range of three types of samples. As is apparent from FIG. 7, this is because as the distance between the body region and the SiGe channel region 24 in which the same n-type impurity is doped increases, the potential corresponding to the carriers running at the valence band in the built-in potential condition decreases and the threshold decreases.

With all these results considered, it is also possible for the SiGe-HDTMOS having a box type composition to expand the operating voltage range of the transistor by providing the relatively thick undoped Si buffer layer 33 below the SiGe channel region 24.

This embodiment has described the HDTMOS with Si/SiGe/Si stack-deposited as an example, but the same applies to an Si/SiC/Si structured HDTMOS, too.

This embodiment has described the SiGe-HDTMOS formed on the SOI substrate, but also when a bulk substrate such as a bulk silicon substrate is used as the semiconductor substrate, the SiGe-HDTMOS of the present invention can demonstrate similar effects as those of this embodiment.

Fourth Embodiment

Then, a fourth embodiment will be explained which is an example of a complementary HDTMOS (hereinafter referred to as "graded composition SiGeC-cHDTMOS") making up the channel region using a graded composition SiGeC ($Si_{1-x-y}Ge_xC_y$).

In the Si/SiGe heterojunction section, a band offset (hetero-barrier) appears mainly at the edge of the valence band which is advantageous in confining holes as shown in FIG. 2, while in the Si/SiC heterojunction section, the band offset (hetero-barrier) appears mainly at the edge of the conduction band which is advantageous in confining electrons as shown in FIG. 5. On the contrary, in the Si/SiGeC ($Si_{1-x-y}Ge_xC_y$) heterojunction section, band offsets (hetero-barrier) are formed at the edges of both the conduction band and valence band by appropriately adjusting the contents x and y of Ge and C. That is, the single SiGeC ($Si_{1-x-y}Ge_xC_y$) layer can be used to form an n-channel where electrons are confined in the SiGeC layer and run in the SiGeC layer and a p-channel where holes are confined in the SiGeC layer and run in the SiGeC layer.

Figure 9:
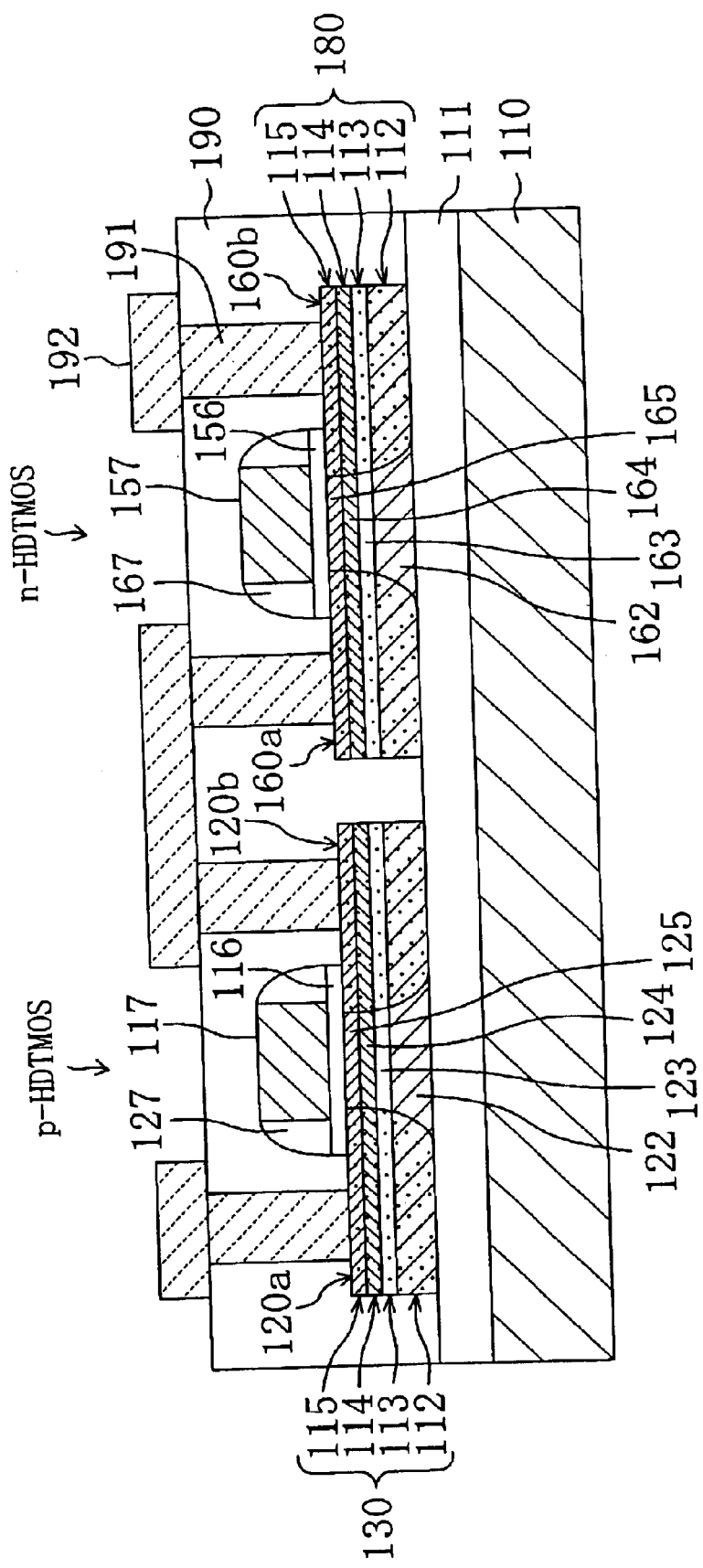
FIG. 9 is a cross-sectional view showing a structure of a graded composition SiGeC-cHDTMOS according to a fourth embodiment.

FIG. 9 is a cross-sectional view of a structure of the graded composition SiGeC-cHDTMOS according to this embodiment. As shown in the same figure, the HDTMOS of this embodiment includes a p-type Si substrate 110, a buried oxide film 111 formed using a method for implanting oxygen ions into an Si substrate, etc. and a p-channel type HDTMOS (p-HDTMOS) semiconductor layer 130 provided on the buried oxide film 111 and an n-channel type HDTMOS (n-HDTMOS) semiconductor layer 180 provided on the buried oxide film 111. The semiconductor layers 130 and 180 are constructed of a common film which is formed simultaneously.

The semiconductor layers 130 and 180 are constructed of an upper Si film 112 that makes up the upper section of the SOI substrate, an Si buffer layer 113 epitaxially grown on the upper Si film 112 using a UHV-CVD method, an SiGeC ($Si_{1-x}Ge_xC_y$: x=0 to 0.4, y=0 to 0.03) film 114 having a graded composition epitaxially grown on the Si buffer layer 113 using a UHV-CVD method and an Si film 115 epitaxially grown on the SiGeC film 114 using a UHV-CVD method. Here, the thickness of the buried oxide film 111 is approximately 100 nm, the thickness of the upper Si film 112 is approximately 100 nm, the thickness of the Si buffer layer 113 is approximately 10 nm, the thickness of the SiGeC film 114 is approximately 15 nm and the thickness of the Si film 115 is approximately 5 nm.

Here, as shown in FIG. 9, a feature of this embodiment is that the Ge composition ratio x of the $Si_{1-x}Ge_x$ film 114 has a graded composition that continuously changes from x=0 to x=0.4 from the Si buffer layer 113 to the Si cap layer 115 and that the C composition ratio y has a graded composition that continuously changes from y=0 to y=0.03 from the Si buffer layer 113 to the Si cap layer 115.

By the way, depending on the changes of the Ge composition ratio and the C composition ratio of this embodiment, both the edge of the conduction band and the edge of the valence band are graded, but this embodiment can also be constructed in such a way that only one of the edge of the conduction band or the edge of the valence band is graded.

Furthermore, the p-HDTMOS includes a gate insulating film 116 made up of a silicon oxide film provided on the Si film 115 and a gate electrode 117 provided on the gate insulating film 116. Then, there are a source region 120a and drain region 120b containing high concentration p-type impurities in the regions located at both sides of the gate electrode 117 of the semiconductor layer 130. Furthermore, the region between the source region 120a and drain region 120b of the upper Si film 112 is an Si body region 122 containing high concentration (approximately 1×10¹⁹ atoms·cm⁻³) n-type impurities and the region directly above the Si body region 122 of the Si buffer layer 113 constitutes an undoped if Si region 123. The region between the source region 120a and drain region 120b of the SiGeC film 114 constitutes an SiGeC channel region 124 containing relatively low concentration n-type impurities and the region directly below the gate insulating film 116 of the Si film 115 constitutes an Si cap layer 125 containing low concentration n-type impurities. Furthermore, there is a contact (not shown) which is a conductive member that electrically connects the gate electrode 117 and Si body region 122 and side walls 127 made up of a silicon oxide film are provided on the sides of the gate electrode 117.

Furthermore, the n-HDTMOS includes a gate insulating film 156 made up of a silicon oxide film provided on the Si film 115 and a gate electrode 157 provided on the gate insulating film 156. Then, there are a source region 160a and drain region 160b containing high concentration n-type impurities in the regions located at both sides of the gate electrode 157 of the semiconductor layer 180. Furthermore, the region between the source region 160a and drain region 160b of the upper Si film 112 is an Si body region 162 containing high concentration (approximately 1×10¹⁹ atoms·cm⁻³) p-type impurities and the region directly above the Si body region 162 of the Si buffer layer 113 constitutes an undoped p⁻⁻Si region 126. The region between the source region 160a and drain region 160b of the SiGeC film 114 constitutes an SiGeC channel region 164 containing relatively low concentration p-type impurities and the region directly below the gate insulating film 156 of the Si film 115 constitutes an Si cap layer 165 containing low concentration p-type impurities. Furthermore, there is a contact (not shown) which is a conductive member that electrically connects the gate electrode 157 and Si body region 162 and side walls 167 made up of a silicon oxide film are provided on the sides of the gate electrode 157.

Furthermore, on the substrate, there are an inter-layer insulating film 190, a contact 191 that penetrates the inter-layer insulating film 190 and contacts the source and drain regions 120a, 120b, 160a and 160b and a source/drain electrode 192 that is connected to the contact 191 and extends over the inter-layer insulating film 190.

In the process of manufacturing the graded composition SiGeC-cHDTMOS of this embodiment, the upper Si film which is part of the SOI substrate is made up of an n+ Si layer (p-HDTMOS region) and a p+ Si layer (n-HDTMOS region) in which impurities of concentration of approximately $1\times10^{19}$ atoms·cm$^{-3}$ are doped by means of ion implantation before crystal growth and the Si buffer layer, SiGeC film and Si cap layer epitaxially grown using a UHV-CVD method all constitute undoped layers with no impurities doped in an as-grown state. Then, a silicon oxide film obtained by applying thermal oxidation to the top layer Si film is used as a gate insulating film and an n+-type gate electrode made of polysilicon with a high concentration n-type impurity doped and a p+-type gate electrode made of polysilicon with a high concentration p-type impurity doped are formed thereupon. Then, on both sides of each gate electrode, an n+-type source and drain regions with a high concentration n-type impurity doped by means of ion implantation and a p+-type source and drain regions with a high concentration p-type impurity doped are formed and source electrodes and drain electrodes are formed on top of the respective regions. Furthermore, the gate electrode and Si body region are connected by the contact to obtain an HDTMOS structure.

This embodiment constitutes the channel region with the SiGeC ($Si_{1-x-y}Ge_xC_y$) and can thereby use the single SiGeC ($Si_{1-x-y}Ge_xC_y$) layer to form an n-channel where electrons confined in the SiGeC layer run in the SiGeC layer and a p-channel where holes confined in the SiGeC layer run in the SiGeC layer, making it possible to realize a graded composition SiGeC-cHDTMOS having an Si/SiGeC heterojunction. In that case, as explained in the first and second embodiments, the graded composition SiGeC-cHDTMOS structure makes it possible to reduce the substrate current Ib and expand the operable range while maintaining a low threshold voltage in both nHDTMOS and pHDTMOS.

Thus, the HDTMOS having the channel region made up of SiGeC can realize a high-speed transistor using a heterojunction structure with high current drive power without causing problems such as a reduction of the transistor operating speed due to parasitic channels even if the band offset (height of the hetero-barrier) is relatively small.

Furthermore, using the above described manufacturing method allows high performance graded composition SiGeC-cHDTMOS to be manufactured using a simple manufacturing method.

This embodiment has described the graded composition SiGeC-cHDTMOS, but the present invention is not limited to this embodiment and it goes without saying that it is also possible to provide a semiconductor device only provided with n-channel type HDTMOSs or p-channel type HDTMOSs having a graded composition Si/SiGeC heterojunction section.

INDUSTRIAL APPLICABILITY

The semiconductor device of the present invention is applicable to MOSFETs mounted on electronic devices, and more particularly devices like DTMOSFET and CMOS devices, etc.

What is claimed is:

1. A semiconductor device comprising:
   a semiconductor layer including at least a first semiconductor film and a second semiconductor film which has a band gap different from that of said first semiconductor film and is constructed in such a way that the band gap is reduced from a location adjacent to said first semiconductor film in a direction away from the first semiconductor film;
   a gate insulating film provided on said semiconductor layer;
   a gate electrode provided on said gate insulating film;
   a source region and a drain region formed in regions located at both sides of said gate electrode of said semiconductor layer by introducing a first conductive type impurity;
   a channel region formed in a region located between said source region and drain region of said second semiconductor film by introducing a second conductive type impurity;
   a body region formed in the region located between said source region and drain region of said first semiconductor film by introducing the second conductive type impurity having higher concentration than that of said channel region; and
   a conductive member for electrically connecting said gate electrode and said body region.

2. The semiconductor device according to claim 1, characterized in that said first semiconductor film is made of silicon, and
   said second semiconductor film is constructed of a semiconductor whose composition is expressed by $Si_{1-x2-y2}Ge_{x2}C_{y2}$ ($0\leq x2\leq 1$, $0\leq y2\leq 1$, $x2+y2>0$).

3. The semiconductor device according to claim 2, characterized in that said second semiconductor film is constructed of a semiconductor whose composition is expressed by $Si_{1-x3}Ge_{x3}$ ($0<x3\leq 4$) and the Ge composition ratio of said second semiconductor film increases from the location adjacent to said first semiconductor film upward.

4. The semiconductor device according to claim 2, characterized in that said second semiconductor film is constructed of a semiconductor whose composition is expressed by $Si_{1-y3}C_{y3}$ ($0<y3\leq 0.03$) and the C composition ratio of said second semiconductor film increases from the location adjacent to said first semiconductor film upward.

5. The semiconductor device according to claim 2, characterized in that said second semiconductor film is constructed of a semiconductor with composition $Si_{1-x4}Ge_{x4}C_{y4}$ ($0<x4\leq 0.4$ ($0<y4\leq 0.4$, $0\leq y4\leq 0.03$).

6. The semiconductor device according to claim 1,
   characterized in that said first conductive type is an n-type and said second conductive type is a p-type, and
   of the substrate current that flows from said body region into the region located in the source region and drain region of said first semiconductor film, the component to which holes contribute is smaller than the component to which electrons contribute.

7. The semiconductor device according to claim 1,
   characterized in that said first conductive type is a p-type and said second conductive type is an n-type, and
   of the substrate current that flows from said body region into the region located in the source region and drain region of said first semiconductor film, the component to which electrons contribute is smaller than the component to which holes contribute.

8. The semiconductor device according to claim 1,
   characterized in that said semiconductor layer further comprises a third semiconductor film provided between said first semiconductor film and said second semiconductor film, and further comprises a buffer region containing a second conductive type impurity having lower concentration than that of said body region or an undoped buffer region which is provided in a region located between said source region and drain region of said third semiconductor film.

9. The semiconductor device according to claim 1, characterized in that said semiconductor layer further comprises an Si cap region sandwiched between said second semiconductor film and said gate insulating film.

10. The semiconductor device according to claim 1, further comprising an insulating layer provided below said first semiconductor film.

11. The semiconductor device according to claim 1, further comprising:

a buffer region containing a second conductive type impurity having lower concentration than that of said body region or an undoped buffer region which is provided in a region located between said source region and dram region of said third semiconductor film, wherein said semiconductor layer further includes a third semiconductor film sandwiched between said first semiconductor film and said second semiconductor film.

12. The semiconductor device according to claim 11, characterized in that the thickness of said third semiconductor film is 15 nm or more.

13. The semiconductor device according to claim 12, characterized in that the thickness of said third semiconductor film is 30 nm or more.

14. The semiconductor device according to claim 11, characterized in that said semiconductor layer is further provided with an Si cap region sandwiched between said second semiconductor film and said gate insulating film.

15. The semiconductor device according to claim 11, further comprising an insulating layer provided below said first semiconductor film.

* * * * *

UNITED STATES PATENT AND TRADEMARK OFFICE
CERTIFICATE OF CORRECTION

PATENT NO. : 6,815,735 B2
DATED : November 9, 2004
INVENTOR(S) : Akira Inoue et al.

It is certified that error appears in the above-identified patent and that said Letters Patent is hereby corrected as shown below:

Title page,
Item [56], References Cited, U.S. PATENT DOCUMENTS,
"5,777,364 A", change "Crabbe et al" to -- Crabbé et al --;
OTHER PUBLICATIONS, "Si Ge–Channel Heterojunction" reference, change "SiGe-Channel Heterojunction *p*-MOSFET" to -- SiGe-Channel Heterojunction *p*-MOSFET's --.

Column 18,
Lines 3 and 4, change " $Si_{1-x4}\text{-}Ge_{x4}C_{y4}$ (0<x4≤0.4(0<y4≤0.4, 0≤y4≤0.03)" to -- $Si_{1-x4-y4}Ge_{x4}C_{y4}$ (0<x4≤0.4, 0<y4≤0.03) --;
Line 4, change "(0<x3≤4)" to -- (0<x3≤0.4) --;

Column 19,
Line 7, change "dram region" to -- drain region --.

Signed and Sealed this

Twenty-fourth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,815,735 B2
DATED : November 9, 2004
INVENTOR(S) : Akira Inoue et al.

It is certified that error appears in the above-identified patent and that said Letters Patent is hereby corrected as shown below:

Title page,
Item [56], References Cited, U.S. PATENT DOCUMENTS,
"5,777,364 A", change "Crabbe et al" to -- Crabbé et al --;
OTHER PUBLICATIONS, "Si Ge–Channel Heterojunction" reference, change "SiGe-Channel Heterojunction $p$-MOSFET" to -- SiGe-Channel Heterojunction $p$-MOSFET's --.

Column 18,
Line 31, change "(0<x3≤4)" to -- (0<x3≤0.4) --;
Lines 42 and 43, change "$Si_{1-x4}Ge_{x4}C_{y4}$ (0<x4≤0.4(0<y4≤0.4, 0≤y4≤0.03)" to -- $Si_{1-x4-y4}Ge_{x4}C_{y4}$ (0<x4≤0.4, 0<y4≤0.03) --;

Column 19,
Line 18, change "dram region" to -- drain region --.

Signed and Sealed this

Twentieth Day of September, 2005

JON W. DUDAS
*Director of the United States Patent and Trademark Office*